United States Patent [19]

Haisma et al.

[11] Patent Number: 4,970,175

[45] Date of Patent: Nov. 13, 1990

[54] METHOD OF MANUFACTURING A SEMICONDUCTOR DEVICE USING SEG AND A TRANSITORY SUBSTRATE

[75] Inventors: Jan Haisma; Johannes E. A. M. van den Meerakker; Josephus H. C. van Vegchel, all of Eindhoven, Netherlands

[73] Assignee: U.S. Philips Corporation, New York, N.Y.

[21] Appl. No.: 389,650

[22] Filed: Aug. 4, 1989

[30] Foreign Application Priority Data

Aug. 9, 1988 [NL] Netherlands .................... 8801981

[51] Int. Cl.$^5$ ............................................. H01L 21/20
[52] U.S. Cl. ................................ 437/90; 148/DIG. 26; 357/49; 437/63; 437/86; 437/99; 437/978
[58] Field of Search ................ 148/DIG. 26, 50, 114, 148/118, 152; 156/610–614, 662, 649; 357/47, 49, 50, 55; 437/61, 62, 64, 63, 81, 83, 86, 89, 90, 99, 962, 976, 978

[56] References Cited

U.S. PATENT DOCUMENTS

| | | | |
|---|---|---|---|
| 3,850,707 | 11/1974 | Bestland | 437/62 |
| 4,530,149 | 7/1985 | Jastrzebski et al. | 437/90 |
| 4,820,653 | 4/1989 | Easter et al. | 437/62 |
| 4,849,371 | 7/1989 | Hansen et al. | 437/89 |
| 4,851,366 | 7/1989 | Blanchard | 437/61 |
| 4,879,258 | 11/1989 | Fisher | 437/225 |
| 4,902,641 | 2/1990 | Koury, Jr. | 437/86 |
| 4,908,328 | 3/1990 | Hu et al. | 437/90 |

FOREIGN PATENT DOCUMENTS

| | | | |
|---|---|---|---|
| 0192346 | 11/1983 | Japan | 437/89 |
| 0197739 | 11/1983 | Japan | 437/89 |
| 0019350 | 1/1984 | Japan | 437/89 |
| 0054452 | 3/1985 | Japan | 437/90 |
| 0016544 | 1/1986 | Japan | 437/90 |

*Primary Examiner*—Olik Chaudhuri
*Assistant Examiner*—William Bunch
*Attorney, Agent, or Firm*—Norman N. Spain

[57] ABSTRACT

A method of manufacturing a semiconductor device in which a silicon layer (8) is epitaxially grown on the surface of a doped monocrystalline semiconductor body (7), whereafter a connection is established between said semiconductor body (7) and a second semiconductor body (1) which is used as a supporting body, while at least one of the surfaces of the two bodies is firstly provided with an insulating layer (2,3) and a rigid connection is established between the bodies, whereafter the monocrystalline semiconductor body (7) is electrochemically etched away down to the epitaxially grown silicon layer (8), parts of the insulating layer (2,3) being removed prior to establishing the connection between the bodies (1,7), whereafter a layer of electrically conducting material (6) is deposited on the surface with a thickness which is larger than that of the insulating layer, whereafter a polishing treatment is performed at least down to the insulating layer.

4 Claims, 2 Drawing Sheets

METHOD OF MANUFACTURING A SEMICONDUCTOR DEVICE USING SEG AND A TRANSITORY SUBSTRATE

The invention relates to a method of manufacturing a semiconductor device in which a silicon layer is epitaxially grown on the surface of a doped monocrystalline semiconductor body, whereafter a connection is established between said semiconductor body and a second semiconductor body which is used as a supporting body, while at least one of the surfaces of the two bodies is firstly provided with an insulating layer and a rigid connection is established between the bodies, whereafter the monocrystalline semiconductor body is electrochemically etched away down to the epitaxially grown silicon layer. Such a method is known from the Netherlands Patent Application No. 8501773 (PHN 11.428) laid open to public inspection.

The known method aims at obtaining a semiconductor device in which monocrystalline layers on an insulator are obtained (S.O.I., silicon on insulator). In such a process very thin semiconducting layers can be used for obtaining semiconductor devices having a very favourable performance. Such devices are satisfactorily resistant to external radiation.

In the known method the monocrystalline semiconductor body is etched away after the tight connection is established between the surfaces of the said bodies and the etching operation stops automatically where the epitaxially grown silicon layer, which is weakly doped in comparison with the semiconductor body, begins. To obtain a satisfactory electrochemical etching process, it is necessary for the semiconductor body to be highly doped (more than $10^{19}$ atoms per cm$^3$). The epitaxially grown (for example an n-doped) silicon layer is weakly doped (fewer than $10^{15}$ atoms per cm$^3$) so as to ensure a good etch-stop. The use of highly doped material has the drawback of easily creating inhomogeneities in the doping of the material, so that during etching the etching liquid reaches the weakly doped epitaxial layer faster at one location than at the other. Thus a layer having an inhomogeneous thickness will form. A highly doped semiconductor body in combination with a weakly doped epitaxial layer also has the drawback that the deviating structure on the adhesion surface of the two parts may lead to mechanical stresses. Then there is also the risk of obtaining an inhomogeneous layer.

An object of the invention is, inter alia, to provide a method of manufacturing a semiconductor device in which a thin semiconducting layer with a very uniform thickness is obtained on an insulating layer.

According to the invention a method of the type described in the opening paragraph is therefore characterized in that parts of the insulating layer are removed prior to establishing the connection between the bodies, whereafter a layer of electrically conducting material is deposited on the surface with a thickness which is larger than that of the insulating layer, whereafter a polishing treatment is performed at least down to the insulating layer.

A very homogeneous layer is realised on an insulator by means of the method according to the invention. Alternatively, such a layer may be very thin as compared with a layer obtained by means of the known method. This is particularly advantageous in a submicron process, such as in the manufacture of a CMOS circuit.

The invention is based on the recognition that an electrical potential is maintained during the electrochemical etching process via the relatively highly doped conducting polysilicon which is present only at certain locations in the insulating layer. This polysilicon extends as far as the interface between the supporting body and the insulating layer. Thus the use of relatively highly doped semiconductor material in the semiconductor body is avoided. (In a practical embodiment the semiconductor body is p-doped and comprises approximately $7.10^{14}$ atoms per cm$^3$). The mechanical stresses on the interface between the grown weakly doped epitaxial layer and the semiconductor body hardly occur, inhomogeneities in the doping of the material are absent and diffusion of doping atoms from the highly doped material into the weakly doped material is avoided.

In a preferred embodiment of the method according to the invention the insulating layer is formed as a double layer of an insulating layer and a polish-stopping insulating layer.

In a practical embodiment the polish-stopping layer is present on the side of the insulating layer remote from the supporting body.

Such a polish-stopping layer (which comprises silicon nitride in a special embodiment) is notably advantageous when using a chemical etching process. In such an etching process the assembly of supporting body and semiconductor body functions as a first electrode in a chemical bath and a second electrode, at some distance from the first electrode, is present in the bath on the side of the semiconductor body. The field lines of the potential between the electrodes extend through the defined electrically conducting parts of the conducting material such as highly doped polysilicon. The potential is responsible for the chemical process in which passivation occurs as soon as the epitaxial layer is reached during etching. This means that silicon dioxide, which does not dissolve in the etching bath, is formed on the epitaxial layer. The advantage of silicon nitride is that such a material is mechanically tough and chemically inert.

The parts which are removed in the insualting layer are preferably localized where scratch lines are provided at a later stage The finished products are cut along the scratch lines at a later stage, thus obtaining separate semiconductor elements. It has been found that the conducting material in the grooves does not have any influence on the operation of the semiconductor device.

The invention will be described in greater detail with reference to the drawing showing an embodiment of the method according to the invention.

In the drawing

Figure 1:
FIG. 1 shows a semiconductor body used as a supporting body.
Figure 2:
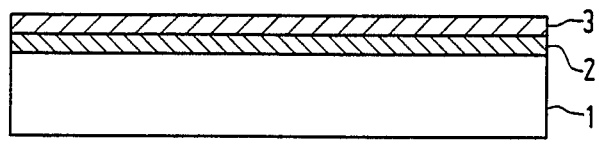
FIG. 2 shows the supporting body of FIG. 1 whose surface is provided with an electrically insulating layer and a polish-stopping insulating layer.

FIGS. 1 and 2 show the supporting body which comprises, for example an n-doped silicon support 1. A thin insulating layer (thickness aspproximately 1 μm) of silicon oxide 2 is thermally provided on this support and a thin polish-stopping insulating layer 3 (thickness approximately 0.2 μm) comprising silicon nitride is provided on this silicon oxide layer. The latter is effected by means of an LPCVD (low-pressure chemical vapour deposition) process. The surface of the support 1 is planed and smoothed before oxidation by means of a bulk-reducing polishing treatment. In such a polishing treatment at least 10 μm of material is removed. Subsequently the oxidizing treatment is carried out and, as stated above, the layer of $Si_3N_4$ is provided on the oxide layer. Then the $Si_3N_4$ layer 3 is subjected, if necessary, to a bondactivating operation, for example, by lightly polishing the surface. As is showin in FIG. 3, the body of FIG. 2 is then subjected to an etching step by providing so-called etching grooves (4, 5) in the two layers 2 and 3. The drawing shows two such grooves by way of example. These grooves extend as far as the silicon of the supporting body. The etching grooves are preferably localized at those locations where scratch lines are proved at a later stage.

Figure 3:
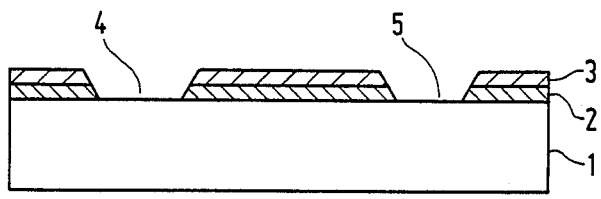
FIG. 3 shows the supporting body in which grooves are provided in the two layers by means of etching.
Figure 4:
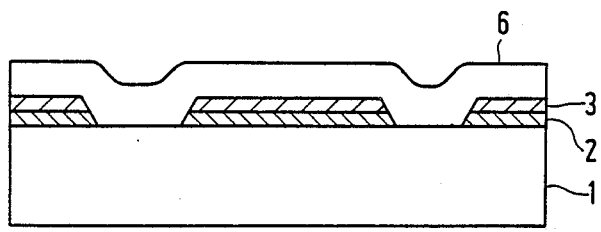
FIG. 4 shows the supporting body of FIG. 3 in which a layer of electrically conducting polycrystalline silicon is deposited on the surface.

FIG. 4 shows the body according to FIG. 3 in which a layer of conducting polycrystalline silicon 6 is deposited on the surface. The thickness is larger than that of the layers 2 and 3 combined.

Figure 5:
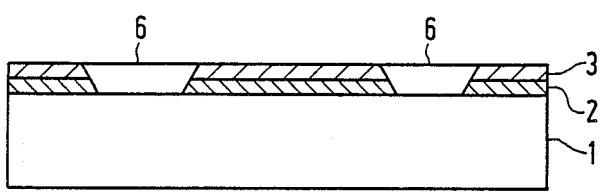
FIG. 5 shows the supporting body of FIG. 4 in which the polycrystalline silicon is plane-polished down to the polish-stopping insulating layer.

FIG. 5 shows the situation in which the surface is plane-polished down the polish-stopping layer 3.

Figure 6:
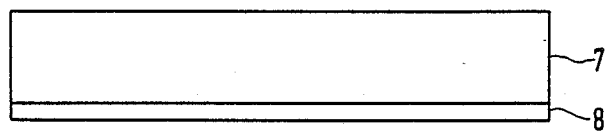
FIG. 6 shows a second semiconductor body having an n-doped this epitaxially grown silicon layer.

FIG. 6 shows the p-doped semiconductor body 7 on which a thin layer 8 of n-doped silicon is grown epitaxially. Subsequently the bodies according to FIGS. 5 and 6 are cleaned and their layers 3 and 8 are contacted with each other in a dust-free atmosphere (see FIG. 7). A spontaneous adhesion then takes place, which is known under the term of wringing on. The optically smooth surfaces are subjected to a van der Waals bond or dipole bond. By causing the assembly to undergo a temperature treatment of at least 350° C., the adhesive effect is still enhanced. An electrical contact member 9 is provided on the lower side of body 1.

Figure 7:
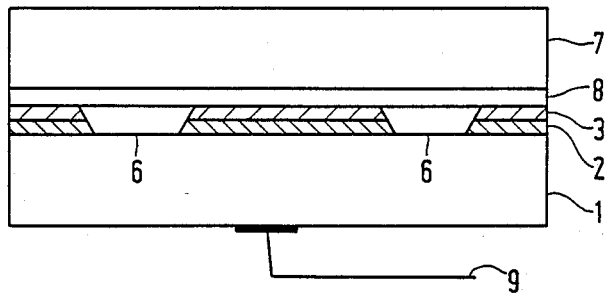
FIG. 7 shows an assembly of the supporting body of FIG. 5 and the semiconductor of FIG. 6.
Figure 8:
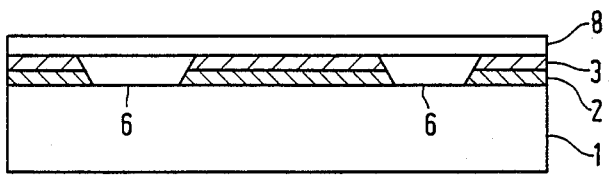
FIG. 8 shows the assembly of FIG. 7 in which a thin silicon layer according to the invention is formed.

The p-doped part 7 of the semiconductor body is subsequently etched away down to the epitaxial layer 8 by means of a electro-chemical process. The assembly of the body 1 and body 7 (as shown in FIG. 7) is then placed in a hot bath (T~80°) of an aqueous solution of sodium hydroxide (7N) and brought to an electrical potential. This electrical potential is passed on to the epitaxial layer 8 via the conducting polycrystalline silicon 6. This assembly functions as a first electrode. By means of an opposite electrical potential at a second electrode in the bath the n-doped material is thus passivated so that the etching process stops. The product according to FIG. 8 is obtained in this way.

It will be evident that variations within the scope of the invention are possible to those skilled in the art so that many other semiconductor devices can be realised by means of the method according to the invention. As a modification of the method as described above it is possible not to form the insulating layer as a double layer with a polish-stopping insulating layer. The conducting polycrystalline silicon is then provided in parts of the insulating layer only.

In the above-mentioned embodiment it has been described that the insulating and the polish-stopping insulating layers are provided on the supporting body. It is alternatively possible to provide these layers on the epitaxially grown layer.

What is claimed is:

1. A method of manufacturing a semiconductor device in which a silicon layer is epitaxially grown on the surface of a doped monocrystalline semiconductor body, whereafter a connection is established between said semiconductor body and a second semiconductor body which is used as a supporting body, while at least one of the surfaces of the two bodies is firstly provided with an insulating layer and a rigid connection is established between the bodies, whereafter the monocrystalline semiconductor body is electrochemically etched away down to the epitaxially grown silicon layer, characterized in that parts of the insulating layer are removed prior to establishing the connection between the bodies, whereafter a layer of electrically conducting material is deposited on the surface with a thickness which is larger than that of the insulating layer, whereafter a polishing treatment is performed at least down to the insulating layer.

2. A method as claimed in claim 1, characterized in that the insulating layer is formed as a double layer of an insulating layer and a polish-stopping insulating layer.

3. A method as claimed in claim 2, characterized in that the polish-stopping layer comprises silicon nitride.

4. A method as claimed in claim 1, characterized in that the removed parts in the insulating layer are localized at areas were scratch lines are provided at a later stage.

* * * * *